United States Patent [19]
Gimzewski

[11] Patent Number: 5,910,837
[45] Date of Patent: Jun. 8, 1999

[54] PHOTOMECHANICAL TRANSDUCER

[75] Inventor: James Kazimierz Gimzewski, Rueschlikon, Switzerland

[73] Assignee: International Business Machines Corporation, Armonk, N.Y.

[21] Appl. No.: 08/719,812

[22] Filed: Sep. 25, 1996

[30] Foreign Application Priority Data

May 24, 1994 [WO] WIPO ............ PCT/IB96/00494

[51] Int. Cl.⁶ .................................................. G01J 1/00

[52] U.S. Cl. ............... 356/213; 356/235; 356/216; 356/32; 356/234

[58] Field of Search ................... 356/213, 235, 356/216, 32, 234

[56] References Cited

U.S. PATENT DOCUMENTS

| | | | |
|---|---|---|---|
| 3,901,588 | 8/1975 | Longhenry | 356/235 X |
| 4,252,440 | 2/1981 | Fedors et al. | 356/216 |
| 4,891,512 | 1/1990 | Naden | 250/227 |
| 5,335,060 | 8/1994 | Gentile et al. | 356/213 |

*Primary Examiner*—Frank G. Font
*Assistant Examiner*—Reginald A. Ratliff
*Attorney, Agent, or Firm*—McGinn & Gibb, P.C.

[57] ABSTRACT

The invention relates to a photomechanical transducer which comprises a photochromic element made of a first material and attached on a carrier element made of a deformable second material. The first material of the photochromic element changes its molecular shape when it is irradiated with light and thereby introduces a strain into the carrier element which as a result is deformed.

18 Claims, 4 Drawing Sheets they are therefore used for security-printing, sunglass coatings or for optical data storage. A known photochromic material is bacteriorhodopsin which undergoes isomerization under illumination by photons with a quantum efficiency of 70%. The bacteriorhodopsin thereby switches between two states and the backswitching is induceable by thermal energy or photo-illumination with light with a different wavelength. There exist various classes of photochromic materials differing by their switching mechanism, such as H-tautomerism, dissociation, dimerization, cis-trans isomerization or charge transfer.

PHOTOMECHANICAL TRANSDUCER

TECHNICAL FIELD

The present invention relates to a photomechanical transducer, more particularly to a photomechanical actuator, a photomechanical display, a photomechanical sensing device, a photomechanical array and a photomechanical storage device.

BACKGROUND OF THE INVENTION

The invention is related to the field of photochromic materials and photomechanical transducers. Photochromic materials reversibly change their absorption spectrum by absorption of light. They are therefore used for security-printing, sunglass coatings or for optical data storage. A known photochromic material is bacteriorhodopsin which undergoes isomerization under illumination by photons with a quantum efficiency of 70%. The bacteriorhodopsin thereby switches between two states and the backswitching is induceable by thermal energy or photo-illumination with light with a different wavelength. There exist various classes of photochromic materials differing by their switching mechanism, such as H-tautomerism, dissociation, dimerization, cis-trans isomerization or charge transfer.

A photochromic material is known from U.S. Pat. No. 5,382,78. The disclosed material changes its photoelectric current value responding to the intensity of light irradiation at a constant temperature. Other materials disclosed in this publication exhibit a dependence of temperature.

U.S. Pat. No. 4,957,725 describes a method to form a layer of vanadium dioxide as a photosensitive layer. Vanadium dioxide changes its optical transmission, electrical resistance and spectral transmission characteristic depending on the wavelength of incident light.

A photomechanical transducer responding to light is already known from U.S. Pat. No. 4,252,440. The transducer comprises an ultrathin strip of polymeric or metallic film which is held under a small and constant strain. This film is sensitive to light and changes its strain due to thermal expansion or contraction in response to light absorption by the strip. Another light sensitive device is described in U.S. Pat. No. 4,891,512. A fiber end forming a cantilever is bent by an attached metallic pad which responds to the local heating produced by incident light.

In U.S. Pat. No. 4,945,514 is described a method of bistable optical information storage. The underlying principle is a light-activated shift of a field-dependent transition between two phases. The device is sensitive to near-UV- and visible light.

U.S. Pat. No. 5,242,491 discloses a gel whose volume changes by irradiation with light. The gel comprises a polymerized monomer, a photosensitive component and a liquid medium. The mixture changes its internal structure in that the contained polymer chains change their orientation with respect to each other. This intermolecular change involves the variation of the solvent in the polymer mixture thus varying the swelling factor of the gel. The interaction between the various molecules can however not be well defined on a macroscopic scale.

OBJECT AND ADVANTAGES OF THE INVENTION

It is an object of the invention to provide a device, namely a photomechanical transducer, which transforms optical information into mechanical information by absorption of light by making use of an intramolecular change, which means avoiding the need of a second material, and without using thermal effects.

The device according to independent claim 1 shows the advantage that it provides a photomechanical transducer which responds to irradiation with light without using the secondary effect of temperature change. This makes the proposed device also usable for irradiation with radiation from the part of the light-spectrum which does not or only to a small extent produce thermal changes. Further, by making it possible to use such light, the device can be operated whereby no or only low thermal change occurs in the device due to the incident light, which brings the advantage that thermal fatigue is avoided or at least reduced.

Further the used effect of intramolecular structural changes does not need any further materials and does hence allow a simplified manufacturing process for the invented device, particularly the production of the photochromic element in form of an ultrathin film. Further contributing to the availability of the small-size area is the fact that the strain in the photochromic element is induced through intramolecular changes, which means that already a single molecule suffices to perform the switching process, the molecule being the smallest entity of the photochromic element. This makes feasible the ultrasmall-size range, in the extreme case with even only one photochromic molecule representing the photochromic element.

Additionally, the intramolecular changes without thermal effects show a very short transient time between two different molecular states. This makes feasible the high-frequency range for switching.

The subclaims of claim 1 contain different measures which represent advantageous improvements and developments of the invention claimed in claim 1. The fact that the deformation only occurs when the incident light has a predetermined wavelength, is advantageous because by this a wavelength-selective photomechanically switched sensor and a photomechanical switch can be realized. Such a photomechanical switch may be used particularly as a spectral sensing element or detector. By arranging a plurality of such switches with different switching wavelengths also a spectral analyzer can be obtained.

Choosing a material which is switched by light with a predetermined first wavelength and which can be switched back with light with a predetermined second wavelength provides for a sort of optically programmable memory which can be programmed with light signals with said first wavelength and can be erased with the light having the second wavelength. Furthermore, if both wavelengths are chosen to lie out of the spectrum of light bulbs or daylight, this wavelength-selective optically programmable memory may be first programmed by exposure to light with the first wavelength and then be handled safely without loss of the programmed information without needing to care about eventual environmental irradiation. The photomechanical switch can be used for a photomechanical data storage device, particularly when arranged in a multitude as an array.

When the switched state of the photomechanical transducer pertains after the irradiation is stopped it can be used as an optically programmable static memory, also called a static photomechanical data storage device. Furthermore, energy consumption of the device is minimized because the illumination can be stopped immediately after the device having switched.

An alternative advantageous solution for backswitching is to make the material of the photochromic element sensitive to thermal radiation or to a chemical material. This opens a huge range of possibilities to ensure the security of the information stored in form of the switching state of the photomechanical transducer by preventing it from unwanted erasure. Or even erasure is made possible with easy-to-provide environmental conditions, since for example a heat source is easily providable nearly everywhere whereas a light-source with a predetermined wavelength may be not.

A self-backswitching embodiment of the claimed photomechanical transducer is usable as an oscillator which only needs one photochromic element for performing an oscillation. Thereby a complicated arrangement for creating deformations in opposite directions is not needed. Furthermore, the device only needs to be illuminated once for making it perform an entire oscillation. In total, this embodiment represents the most simple way to realize an optically controllable oscillator. Another application of this embodiment is the use as a dynamic storage element in a dynamic photomechanical data storage device.

The implementation of the photomechanical transducer in form of a cantilever represents a very simply realizable embodiment which allows cost-saving mass production. In addition to that, cantilevers are extremely sensitive to surface stress which means that this embodiment shows a high quantum efficiency. This also means that the photochromic element can be carried out very thin while nevertheless keeping the high sensitivity.

To add an additional photochromic element which is also photosensitive provides for a more universal device since different, even nonadjacent wavelength ranges can be used for switching. Also by this a photomechanical transducer with several different switching states can be designed.

To design the device such that the directions of the deformations are different from each other makes it possible to use even more complex deformation schemes, particularly with directions perpendicular to each other. Such complex schemes can be advantageously used to design a photomechanical sensing device or a photomechanical actuator with more than two switching states and with use of two or even three dimensions of motion.

It proves itself also very useful to stack several photochromic elements on each other since this leads to a minimization of the device's size while still several wavelength ranges may be chosen to control the switching states of the various photochromic elements. Additionally the direction of the incident light may be chosen equal for all photochromic elements which can be used to unite all light sources in one light source, maybe with a controllable wavelength for the emitted light. Thus, a very variable photomechanical transducer is obtainable by being able to design its sensitivity concerning different wavelength ranges and/or illumination directions.

A very simple and small-sized sensor for sensing the position and/or movement of the moving part of the photomechanical transducer is realized by providing an electrically conducting element in which an electric current is induced by a magnetic element moved by the carrier element and/or the photochromic element.

A pickup coil is especially suited for measuring the movement since it is very sensitive and can be sized also very small.

The movement and/or position of the carrier element can be optically measured by providing a reflector element at a moving part. Furthermore, such a reflector element can serve to make the device useable as a sort of reflective display element.

The range of selectable materials for the photochromic element is enlarged in an advantageous manner by adding a means which increases or decreases the ability of the carrier element respectively the photochromic element to remain in its deformed state or to return into the nondeformed state. Hence, materials can be chosen which without such means do not perform the switching in the desired way, but which due to the presence and the effect of said means do perform as wanted. Materials which for instance are too elastic can be damped in their motion or prevented from rebending by electrostatic forces, others being too inert may be accelerated by spring means or also by electrostatic forces. This can be used to induce bistability or multistability. For some special embodiments the light-source can be integrated into the transducer and form a sort of optocoupler or electromechanical transducer with a broad application spectrum. This embodiment is also well suited for the integration of a light-source with a controllable emission spectrum.

Integrating a light-detector into the photomechanical transducer provides a photoelectrical sensor with very high spectral and/or spatial resolution. Since the photomechanical transducer is suited for being realized in a very small size it is predetermined to be used as a photomechanical actuator in an atomic force microscope or even in a writing and/or reading head for any kind of storage device, such as a hard-disk drive, a CD-Rom drive, in general any kind of drive with relative motion between the head and the storing means.

When the carrier element is transparent for the incident light, an illumination of the photochromic element whereby the light penetrates the carrier element is possible which proves useful in the case when the side where the photochromic element is situated is not easily accessible for the incident light.

Since the photomechanical transducer can be designed to be illuminated with light with a predetermined wavelength and afterwards to stay in the deformed state at least for a predetermined period of time and since the optical reflection of a light, which does not contain said wavelength and with which said device is illuminated differs between the switching states, the transducer can be used as a photomechanical display when being watched by using the light which does not contain said wavelength.

The same design can be used to function as a photomechanical sensing device. The sensed optical information can be read out by reading the mechanical state of the photomechanical transducer which state, depending on the embodiment, can be for instance represented by an electrical resistance.

The achievable small-size range makes the photomechanical transducer easy to be arranged in a multitude as an array. This array can be spatially selective, which means that each array element has the same switching wavelength range, but is arranged at a different place, and/or spectrally selective, which means that each array element has a different switching wavelength, depending on the preferred design. A very attractive application for the above array is the substitution of a photosensitive film in a camera for taking pictures by illuminating the above array and afterwards reading the switching states for electrically storing said picture, or also creating printouts of it.

SUMMARY OF THE INVENTION

The invented device is in principle composed of two different materials, the materials having different optical expansion coefficients. It has been found that such an element can be realized as a very small device which despite its small size still shows clearly distinguishable switching states. Further the proposed device shows a high critical switch frequency.

DESCRIPTION OF THE DRAWINGS

Examples of the invention are depicted in the drawings and described in detail below by way of example. It is shown in FIG. 1a: a cross-section of an embodiment with a cantilever in a first switching state.

All the figures are for sake of clarity not shown in real dimensions, nor are the relations between the dimensions shown in a realistic scale.

DETAILED DESCRIPTION OF THE INVENTION

Figure 1A:
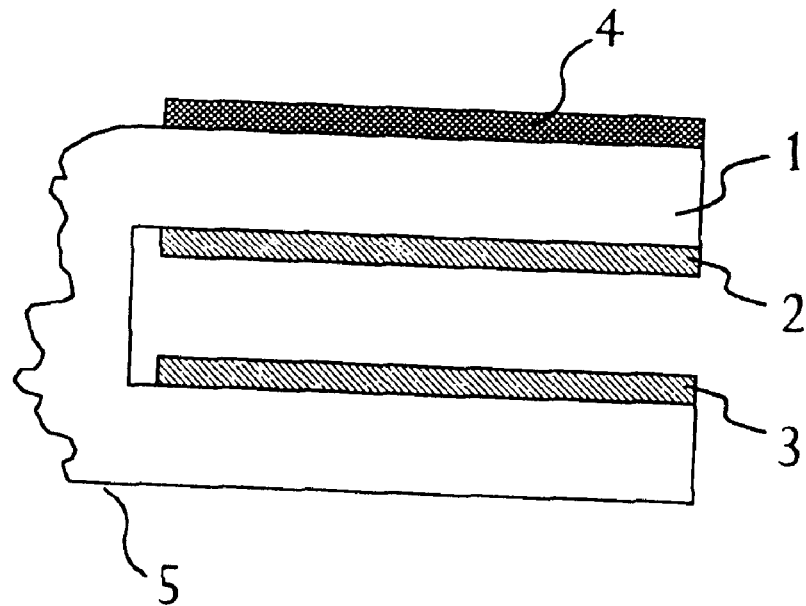
FIG. 1b: a cross-section of the embodiment from FIG. 1a in a second switching state.

In the following the various exemplary embodiments of the invention are described. In FIG. 1a is depicted a photomechanical transducer comprising a substrate element 5 which itself comprises a carrier element 1 in the form of a cantilever. The cantilever 1 bears on its upper side a photochromic element 4. On the underside of the cantilever 1 is attached a first electrode 2. Opposite to the first electrode 2 the substrate 5 has a second electrode 3. The photochromic element 4 is made of a material which changes its molecular shape by the absorption of light.

In FIG. 1a no light irradiation occurs and hence the device pertains in the depicted state. This is defined as the first switching state of the photomechanical transducer.

Figure 1B:
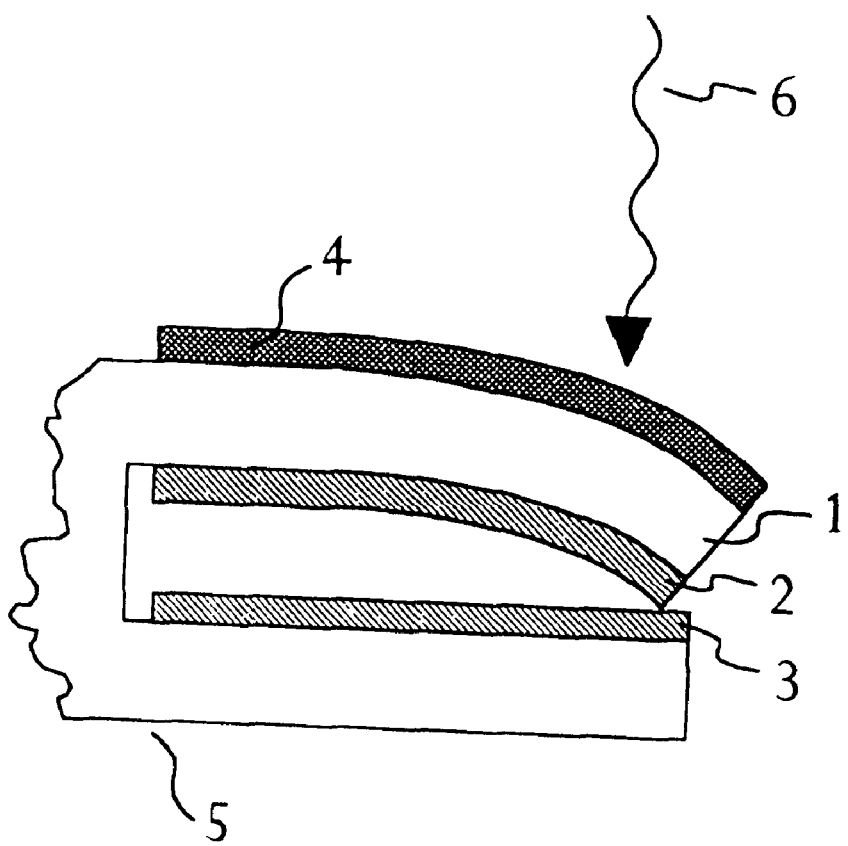

In FIG. 1b the same numbering has been maintained as in FIG. 1. The device of FIG. 1 is illuminated with incident light 6 from the upper side and the photochromic element 4 shows its photochromic behavior. This means that the shape of the molecules of the material of the photochromic element 4 changes and that this leads to a deformation force or strain inside the photochromic element 4 which tends to transduce the strain on the cantilever 1 since this cantilever 1 shows a different photochromic behavior, in the depicted case namely no expansion. Therefore the cantilever 1 bends downwards. The first electrode 2 and the second electrode 3 come into contact which makes the device act as a photosensitive switch. The first material of the photochromic element 4 is for this example chosen to stay in the second switching state also when the irradiation with the incident light 6 is interrupted or stopped. A rebending of the cantilever 1 to the first switching state can by choice of material occur by thermal relaxation at room temperature or by introduction of a heat pulse into the cantilever 1 by a built in heater or an IR-Laser pulse. Other choices provide a backswitching by absorption of light at a different wavelength than the light which caused the switching process. Generally light does here not only mean a light beam, but also single light photons. Another backswitching mechanism is induced by applying an electric field or an electronic voltage or a current. Even a catalytic or other chemical reaction can be used to cause the rebending into the first switching state.

The depicted photomechanical transducer can also be designed to switch other physical variables. Instead of the two electrodes 2, 3 being brought into contact by the bending of the cantilever 1, the gap between the electrodes 2, 3 can contain an electron tunnel junction whose width or the pressure upon which is varied through the switching/backswitching mechanism. Also the distance of a gate electrode from a channel of a fieldeffect device can be varied through the photomechanical transducer.

The mechanism of photochromism is an intramolecular mechanism which means that the molecule itself changes its internal structure. This is a reproducible and well defined process. Forming a well defined structure of the photochromic element 4 on the carrier element 1 for instance as a self-assembled monolayer with a defined orientation, effects that the molecular change of all photochromic molecules is directed into the same predetermined direction. The resulting strain is hence the sum of all induced individual strains of the molecules. Because of this determination, a scaling of the proposed transducer down to a molecular scale is possible. At best only one molecule suffices to achieve a working transducer. Further the intramolecular change is not relying on thermal changes which usually have a relatively low maximal switching- or critical frequency due to the dependence on thermal diffusion processes over large distances.

The intramolecular change however is depending on photon absorption which leads to a much higher critical switching frequency.

All these properties make the photomechanical transducer best suited for use in an array with a large number of transducers. Such arrays are applicable for various devices.

For instance an optically programmable array can be used as a static data storage device with the transducers being switched after the illumination has been switched off. A dynamic data storage device can be obtained with the self-backswitching type of transducers.

When at least adjacent transducers have different programming wavelengths, the needed spatial resolution for the programming is reduced and replaced by a spectral resolution. This reduces manufacturing costs, since a spectral resolution is far easier to realize than a molecular spatial resolution. An optimum will certainly be a combination of both.

The arrays can also be used in the pure optical field, on one hand as displays which make visible a previously programmed picture and on the other hand as optical storage devices in the sense of a digital picture sensor array. This array may substitute a usual film in a photocamera. The illuminated array can be read out for later reproduction and after erasing be used again. A camera can be imagined which opens a shutter, thereby permits illumination of the array, closes the shutter, reads the stored switching states, for instance by measuring the electrical resistance between the electrodes 2, 3 and switches on a small UV-Diode for a time sufficient to assure a complete backswitching of all array elements or transducers and is then ready to take the next photoimage.

The material for the carrier element 1 can be chosen transparent at least for the switching wavelength which is useful when the direct access to the photochromic element 4 is not accessible, for instance for mechanical reasons. Then, with a transparent carrier element 1 the illumination can penetrate it and thus reach the photochromic element 4. If backswitching has to occur with another wavelength a transparence for this wavelength may also be necessary. A transparent material may be used such as, for example silicon nitride.

Figure 2:
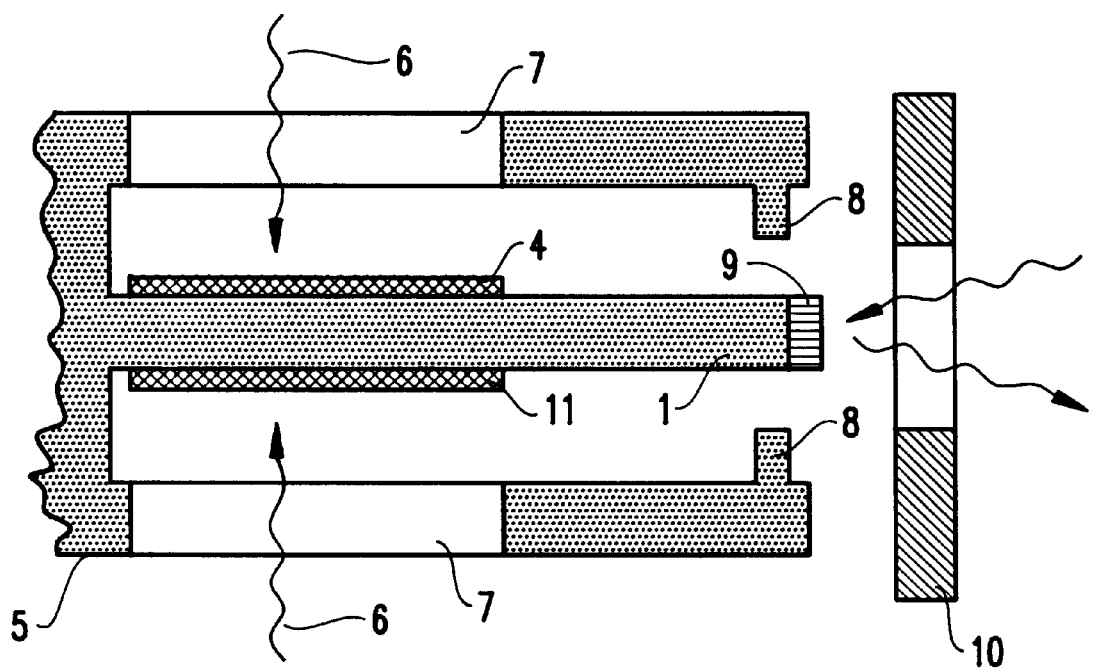
FIG. 2: a cross-section of an embodiment with two photochromic elements on opposite sides of the carrier element.

FIG. 2 shows a further embodiment of the invention. Again the numbers of FIGS. 1a and 1b have been maintained as far as the same parts are concerned. The substrate element 5 here is formed as an "E" whose middle rod is the cantilever 1. The cantilever 1 now does not bear any electrode, neither does the substrate element 5. Here the cantilever 1 carries on its upper side again the photochromic element 4 but additionally carries on its underside a further photochromic element 11. Both photochromic elements 4, 11 are made from a photochromic material which can, but needs not, be the same material. The substrate element 5 has two protrusions 7 exactly above the photochromic element 4 and below the further photochromic element 11. These protrusions 7 allow the incident light 6 to pass through and to reach the photochromic elements 4, 11. At the non-fixed front end the cantilever 1 is provided with a reflector element 9. To either sides of the reflector element 9 the substrate element 5 has a motion-range-restricting post 8 which serves to delimit the maximal deformation of the cantilever 1. In front of said reflector element 9 is arranged an aperture 10 which serves to let light pass onto and away from said reflector element 9.

The photochromic elements 4, 11 can both be irradiated at the same time but also only one or the other. By these possibilities the motion range of the device in comparison with the device of FIGS. 1a and 1b is doubled. Also the choice of materials for this device is leading to different application possibilities.

The reflector element 9 at the front side serves as a reflector for the light coming in through the aperture 10. Since the front end moves between the different switching states it has different stable positions and therefore different reflection directions. A spectator looking at the reflector element 9 from its front side hence can easily recognize the switching state. This device hence acts as a display element.

This embodiment can be varied in that the reflector element 9 and one of the photochromic elements 4, 11 are using the same light which means that the direction in which one of the photochromic elements 4, 11 is light-sensitive at least approximately is the same as the direction from which the light can be directed to the reflector element 9 to be reflected. The light beam for deflection and the switching beam can then be integrated into the same optical system. The beams can even be collinear and focused by the same optical elements.

Furthermore, the embodiment can be carried out in such dimensions that the stability in the various switching states is improved by exploiting electrostatic forces, for instance between the posts 8 and the cantilever 1. Also other stability-improving arrangements are possible such as springs, damping cushions, damping liquids etc. Such arrangements are especially suited when they show a switching hysteresis.

Figure 3A:
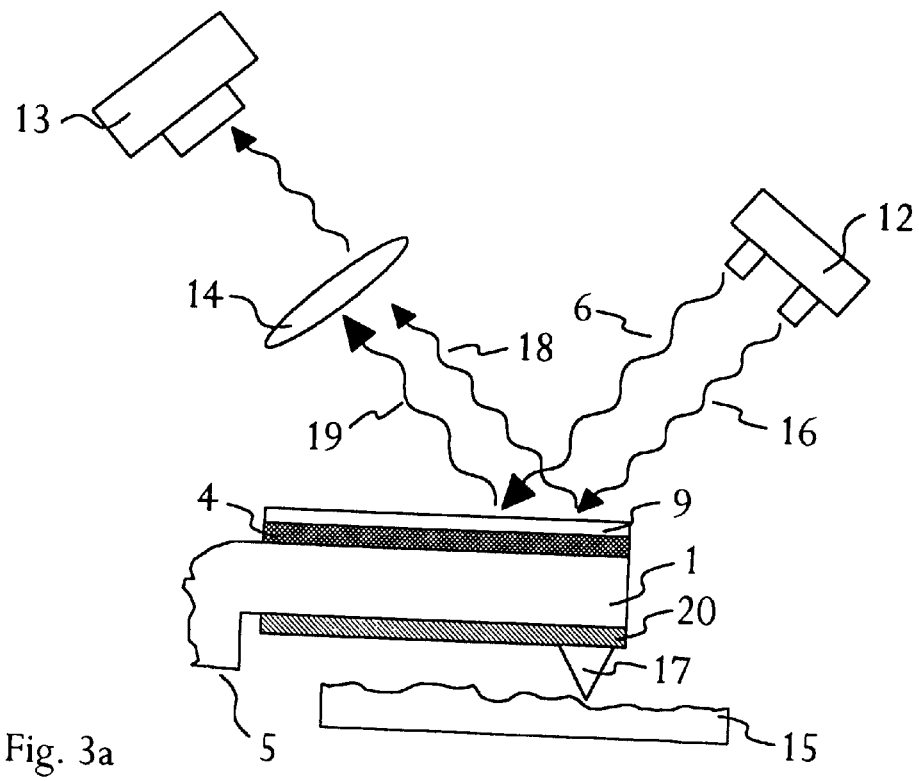
FIG. 3a: a cross-section of an embodiment with a tip and a reflector element in a first switching state.
Figure 3B:
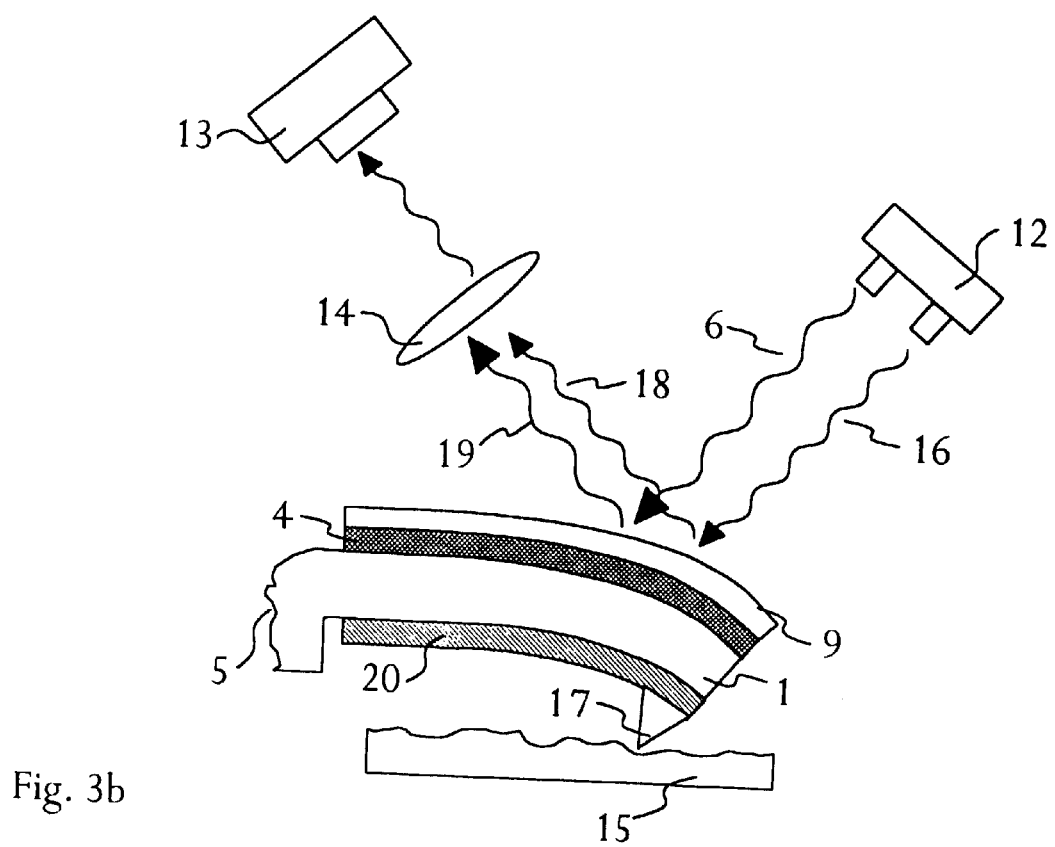
FIG. 3b: a cross-section of the embodiment from FIG. 3a in a second switching state.

FIGS. 3a and 3b show an application embodiment which is especially but not exclusively suited for an atomic force microscope (AFM).

The numbering from the preceding figures has again been maintained concerning identical elements. The cantilever 1 bears on its upper side the photochromic element 4 and upon this photochromic element 4 the reflector element 9. A light source 12 is emitting the incident light 6 as a light beam for switching and a second incident light 16 as a light beam for measuring the bending of the cantilever 1. The light beams 6, 16 are reflected, thereby forming a reflected first light beam 19 and a reflected second light beam 18. On the lower side the cantilever 1 is coated with an attachment layer 20 which serves to fix a tip 17 to the cantilever 1. Underneath the tip 17 is depicted a sample 15 with a rough surface. Further there is arranged a light detector 13 with an intermediate filter 14. The filter 14 is only transparent for the wavelength range of the reflected second light beam 18.

In AFM's the cantilever 1 which bears the fine tip 17 is moved over the surface of the sample 15 which is to be investigated. Several modes exist, some with the tip 17 contacting the surface, others with the tip 17 being kept at a very small distance from the surface. In all modes the position of the tip 17 has to be controlled. For this application a self-backswitching material for the photochromic element 4 may be most useful.

Assuming for example that the tip 17 is led over the surface while searching to maintain a constant force, the tip 17 has to be positioned always at the same distance over the surface. With the incident light 6 the switching is performed while the second incident light beam 16 is reflected at the reflector element 9 towards the filter 14. The filter 14 lets pass only the reflected second light beam 18 which arrives at the light detector 13. The light detector 13 has several spatially separated sensors which detect the position of the incoming light beam. Depending on the switching state of the cantilever 1 the reflected second light beam 18 enters the light detector 13 at different positions. Hence by this apparatus the bending of the cantilever 1 can be measured. By adding a feedback loop one can easily control the intensity of the incident light 6 in such a way that the cantilever 1 maintains its constant distance above the sample 15.

Another mode for an AFM is the oscillating mode where the cantilever 1 is forced to perform a constant oscillation. The approach towards the surface of the sample 15 causes a change of the Eigenfrequency of the cantilever 1 which can be measured with an electric conductive element, for instance with a pickup coil, and a magnetic element attached to the cantilever 1 (not depicted in the drawing).

The embodiment of FIGS. 3a and 3b is also suited for use for any write/read head for data storage systems, such as disk drives. With the optical programming principle of the head a very precise and reproducible positioning is possible.

Instead of rebending, i.e. backswitching due to illumination with light with a special backswitching wavelength also other mechanisms are possible, such as thermal relaxation, which can be accelerated by exerting heat to the transducer, for instance by a built-in heater or by an IR-Laser pulse. Also electrons or other particles can be used for backswitching when the photochromic element is also sensitive to them. Finally also a chemical or a catalytic process are possible to achieve a backswitching. The choice of the backswitching mechanism is easy to be designed by choosing the appropriate material for the photochromic element 4. There exist also photochromic materials which do return into the first switching state by themselves after illumination has stopped, but with a much longer time constant than the switching occurs.

The proposed device works with minimal size, namely with a monomolecular photochromic element 4 and with submicrometer dimensions. Thus an array of multiple devices can be arranged as a matrix array e.g. for a parallel investigation device. Most interesting is an array of such devices with different switching wavelengths. With such an array each device is controllable by selecting its switching wavelength and thereby avoiding complicated focusing systems. Such arrays are principally also suited for use in an AFM as an array-type investigation head for massively parallel surface investigation.

Stacked photochromic elements can also be used when the various overlying photochromic elements are transparent for the actuating (i.e. switching/backswitching) wavelengths of the underlying photochromic elements.

Figure 4A:
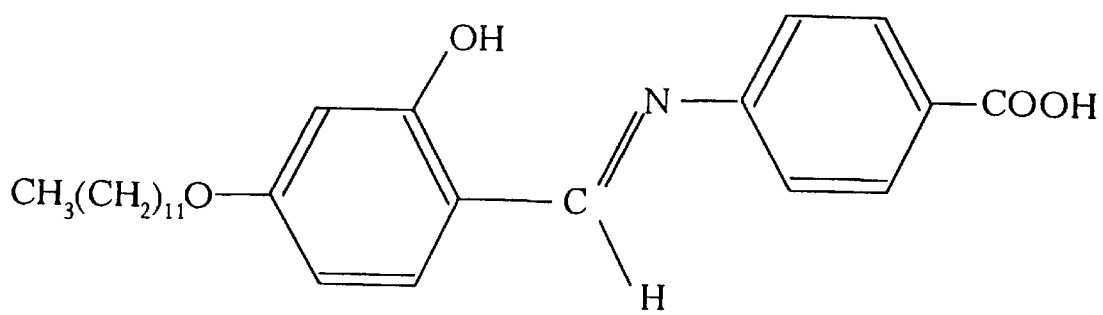
FIG. 4a: the chemical symbolic view of an example of a photochromic material in a first switching state.

FIG. 4a is a chemical symbolic view of the first switching state of photochromic hydrogen tautomerism in N-(4-dodecoxysalicylidene)-4-carboxyaniline. By illumination with a single photon in the UV-range the molecules are switched to a second switching state.

Figure 4B:
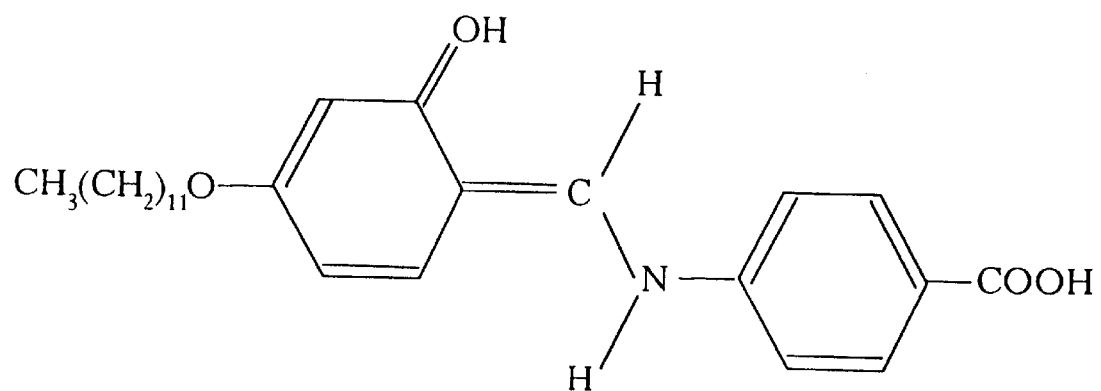
FIG. 4b: the chemical symbolic view of the example of FIG. 4a in a second switching state.

FIG. 4b shows this second switching state. The nitrogen atom together with the benzol and the COOH-group is taking the place of the single hydrogen atom. The OH-group is split up. One of the hydrogen atoms comes to rest at the former position of the nitrogen atom while the other hydrogen atom gets bound to the nitrogen atom in its new position. Illumination with visible light provokes the backswitching process towards the first switching state.

Other such phenomena are to be watched with the Cis-trans photoisomerization of 11-cis-retinal, a photocyclization in the fatigue-resistant, high quantum yield, commercial fulgide Aberchrome 670 and finally also with the photoisomerization of 4-octyl-4'-(5-carboxy-pentamethyleneoxy) azobenzene.

The photochromic material used for the photochromic elements 4, 11 needs not be applied in a pure form but can also be embedded in a layer of a different, even non-photochromic material, as well as be separated from the carrier element 1 by any intermediate layer as long as the functionality of the device is guaranteed. Hence the photochromic element 4, 11 does mean any element which at least contains a photochromic material.

All shown embodiments can be varied in their design without leaving the scope of invention. Such variations comprise the form, number, size or position of any element. Particularly the optical arrangements can be varied with optical elements such as reflectors, lenses, interferometric arrangements, gratings, etc. The attachment layer 20 is only optional. The tip 17 can have any shape or even comprise multiple tips.

I claim:

1. Photomechanical transducer, comprising:
   a carrier element;
   a photochromic element which comprises at least a first material and is attached on the carrier element, said carrier element made of a deformable second material, said first material having a property of changing its molecular shape by the absorption of incident light, thereby introducing a strain into said carrier element, said strain causing a deformation of said carrier element;
   wherein said first material has the property that said deformation occurs only if said incident light has a wavelength which lies in a predetermined wavelength range.

2. Photomechanical transducer according to claim 1, wherein said first material has the property that it returns into the nondeformed state when irradiated with light with a wavelength different from the wavelength at which said deformation occurs.

3. Photomechanical transducer according to claim 1, wherein said first material has the property that said deformation pertains at least for a predetermined period of time when said irradiation with said incident light which caused said deformation is stopped.

4. Photomechanical transducer according to claim 1, wherein said first material has the property that it returns into the nondeformed state when exposed to at least one of a thermal radiation and a chemical material.

5. Photomechanical transducer according to claim 1, wherein said first material has the property that it returns into the nondeformed state automatically after stopping said irradiation with said incident light which caused said deformation.

6. Photomechanical transducer according to claim 1, wherein said carrier element is formed as a cantilever.

7. Photomechanical transducer according to claim 1, wherein said carrier element bears at least one further photochromic element made of a material having the property of changing its molecular shape by the absorption of incident light, thereby introducing a strain into said carrier element, said strain causing a deformation of said carrier element.

8. Photomechanical transducer according to claim 8, wherein said deformation caused by said at least further photochromic element and said deformation caused by said photochromic element are directed in different directions.

9. Photomechanical transducer according to claim 8, wherein said photochromic elements are lying at least partially one over the other.

10. Photomechanical transducer according to claim 1, wherein during the deformation at least one magnetic element is moved which during its motion induces a current in at least one electrical conductive element.

11. Photomechanical transducer according to claim 11, wherein said electrical conductive element comprises at least one pickup coil.

12. Photomechanical transducer according to claim 1, wherein said carrier element bears at least one reflector element.

13. Photomechanical transducer according to claim 1, wherein an ability of said carrier element to remain in said deformed state is increased or decreased by at least one additional element comprising at least one of a spring means, a damping means, and an electrostatic force.

14. Photomechanical transducer according to claim 1, wherein the ability of said carrier element to return to said nondeformed state is increased or decreased by at least one additional element comprising at least one of a spring means, a damping means, and an electrostatic force.

15. Photomechanical transducer according to claim 1, further comprising at least one light source for generating said incident light.

16. Photomechanical transducer according to claim 1, further comprising at least one light detector for detecting light reflected at said reflector element.

17. Photomechanical transducer according to claim 1, wherein said carrier element is transparent at least for said incident light.

18. Photomechanical transducer according to claim 1, wherein said switching mechanism of said first material is at least one of a group comprising tautomerism, dissociation, dimerization, cis-trans isomerization, charge transfer.

* * * * *